| (12) | United States Patent | (10) Patent No.: | US 11,424,335 B2 |
|---|---|---|---|
| | Ma et al. | (45) Date of Patent: | Aug. 23, 2022 |

(54) GROUP III-V SEMICONDUCTOR DEVICES HAVING DUAL WORKFUNCTION GATE ELECTRODES

(71) Applicant: Intel Corporation, Santa Clara, CA (US)

(72) Inventors: Sean T. Ma, Portland, OR (US); Willy Rachmady, Beaverton, OR (US); Gilbert Dewey, Hillsboro, OR (US); Cheng-Ying Huang, Hillsboro, OR (US); Dipanjan Basu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/629,555

(22) PCT Filed: Sep. 26, 2017

(86) PCT No.: PCT/US2017/053542
§ 371 (c)(1),
(2) Date: Jan. 8, 2020

(87) PCT Pub. No.: WO2019/066785
PCT Pub. Date: Apr. 4, 2019

(65) Prior Publication Data
US 2020/0227533 A1 Jul. 16, 2020

(51) Int. Cl.
*H01L 29/423* (2006.01)
*H01L 29/06* (2006.01)
(Continued)

(52) U.S. Cl.
CPC .... *H01L 29/42376* (2013.01); *H01L 29/0673* (2013.01); *H01L 29/20* (2013.01);
(Continued)

(58) Field of Classification Search
CPC . H01L 29/42376; H01L 29/20; H01L 29/201; H01L 29/78681; H01L 29/7856;
(Continued)

(56) References Cited

U.S. PATENT DOCUMENTS 6,153,534 A * 11/2000 Long ................. H01L 29/66659
257/E29.152
6,187,657 B1 * 2/2001 Xiang ............... H01L 21/28202
438/581
(Continued)

FOREIGN PATENT DOCUMENTS

| WO | WO-2016209284 A1 * | 12/2016 | ..... H01L 21/823807 |
| WO | WO-2017052618 A1 * | 3/2017 | ............ B82Y 10/00 |
| WO | WO-2017-105469 | 6/2017 | |

OTHER PUBLICATIONS

Wei Long and K. K. Chin, "Dual material gate field effect transistor (DMGFET)," International Electron Devices Meeting. IEDM Technical Digest, Washington, DC, USA, 1997, pp. 549-552, doi: 10.1109/IEDM.1997.650445 (Year: 1997).*
(Continued)

*Primary Examiner* — Errol V Fernandes
*Assistant Examiner* — Jeremy J Joy
(74) *Attorney, Agent, or Firm* — Schwabe, Williamson & Wyatt, P.C.

(57) ABSTRACT

Group III-V semiconductor devices having dual workfunction gate electrodes and their methods of fabrication are described. In an example, an integrated circuit structure includes a gallium arsenide layer on a substrate. A channel structure is on the gallium arsenide layer. The channel structure includes indium, gallium and arsenic. A source structure is at a first end of the channel structure and a drain structure is at a second end of the channel structure. A gate structure is over the channel structure, the gate structure having a first workfunction material laterally adjacent a
(Continued)

second workfunction material. The second workfunction material has a different workfunction than the first workfunction material.

21 Claims, 12 Drawing Sheets

(51) Int. Cl.
*H01L 29/20* (2006.01)
*H01L 29/40* (2006.01)
*H01L 29/66* (2006.01)
*H01L 29/775* (2006.01)
*H01L 29/78* (2006.01)

(52) U.S. Cl.
CPC ...... *H01L 29/401* (2013.01); *H01L 29/66469* (2013.01); *H01L 29/66795* (2013.01); *H01L 29/775* (2013.01); *H01L 29/7851* (2013.01)

(58) Field of Classification Search
CPC ........... H01L 29/66522; H01L 29/4983; H01L 21/28105; H01L 21/823842
See application file for complete search history.

(56) References Cited

U.S. PATENT DOCUMENTS

| | | | | |
|---|---|---|---|---|
| 6,225,669 | B1* | 5/2001 | Long | H01L 29/518 |
| | | | | 257/547 |
| 6,365,925 | B2* | 4/2002 | Hase | H01L 29/7785 |
| | | | | 257/E29.25 |
| 6,630,720 | B1* | 10/2003 | Maszara | H01L 21/84 |
| | | | | 257/407 |
| 6,791,106 | B2* | 9/2004 | Ohuchi | H01L 21/2807 |
| | | | | 257/E29.152 |
| 6,887,800 | B1* | 5/2005 | Metz | H01L 21/823842 |
| | | | | 438/785 |
| 7,285,829 | B2* | 10/2007 | Doyle | H01L 29/6659 |
| | | | | 257/407 |
| 10,236,353 | B2* | 3/2019 | Nakano | H01L 29/66462 |
| 2001/0017390 | A1* | 8/2001 | Long | H01L 21/28202 |
| | | | | 257/E29.152 |
| 2003/0116781 | A1* | 6/2003 | Ohuchi | H01L 29/4983 |
| | | | | 257/407 |
| 2005/0221548 | A1* | 10/2005 | Doyle | H01L 29/4983 |
| | | | | 257/E21.295 |
| 2006/0244079 | A1* | 11/2006 | Wang | H01L 21/845 |
| | | | | 257/407 |
| 2007/0262395 | A1* | 11/2007 | Gibbons | H01L 21/823425 |
| | | | | 257/392 |
| 2009/0134466 | A1* | 5/2009 | Cho | H01L 27/088 |
| | | | | 438/585 |
| 2009/0142915 | A1* | 6/2009 | Xiong | H01L 29/66583 |
| | | | | 257/E21.477 |
| 2010/0041225 | A1* | 2/2010 | Anderson | H01L 21/823842 |
| | | | | 438/592 |
| 2011/0147837 | A1* | 6/2011 | Hafez | H01L 29/7835 |
| | | | | 257/E29.256 |
| 2014/0001519 | A1* | 1/2014 | Dewey | H01L 29/1054 |
| | | | | 257/288 |
| 2014/0110765 | A1* | 4/2014 | Murali | H01L 21/28088 |
| | | | | 257/E21.409 |
| 2014/0203327 | A1* | 7/2014 | Pillarisetty | H01L 29/165 |
| | | | | 438/285 |
| 2015/0090958 | A1* | 4/2015 | Yang | H01L 29/785 |
| | | | | 257/27 |
| 2015/0263041 | A1 | 9/2015 | Cheng et al. | |
| 2016/0197185 | A1* | 7/2016 | Brask | H01L 29/24 |
| | | | | 257/194 |
| 2017/0179123 | A1* | 6/2017 | Chang | H01L 29/42372 |
| 2017/0263706 | A1* | 9/2017 | Gardner | H01L 29/785 |
| 2018/0145077 | A1* | 5/2018 | Dewey | H01L 29/0847 |
| 2018/0158958 | A1* | 6/2018 | Mohapatra | H01L 29/78696 |
| 2018/0315827 | A1* | 11/2018 | Ma | H01L 21/28264 |
| 2018/0350798 | A1* | 12/2018 | Dewey | H01L 29/66522 |
| 2019/0088759 | A1* | 3/2019 | Sung | H01L 29/42368 |
| 2019/0229182 | A1* | 7/2019 | Wang | H01L 29/0603 |
| 2019/0296145 | A1* | 9/2019 | Huang | H01L 29/1054 |
| 2020/0058738 | A1* | 2/2020 | Afzalian | H01L 29/0847 |

OTHER PUBLICATIONS

Long et al.—Dual Material Gate Field Effect Transistor (DMGFET), International Electron Devices Meeting. IEDM Technical Digest, Washington, DC, USA, 1997, pp. 549-552, doi: 10.1109/IEDM.1997.650445 (Year: 1997).*
Wei Long and K. K. Chin, "Dual material gate field effect transistor (DMGFET)," International Electron Devices Meeting. IEDM Technical Digest, 1997, pp. 549-552, doi: 10.1109/IEDM.1997.650445. (Year: 1997).*
International Search Report and Written Opinion for International Patent Application No. PCT/US2017/053542 dated May 29, 2018, 13 pgs.
International Preliminary Report on Patentability for International Patent Application No. PCT/US2017/053542 dated Apr. 9, 2020, 10 pgs.

* cited by examiner

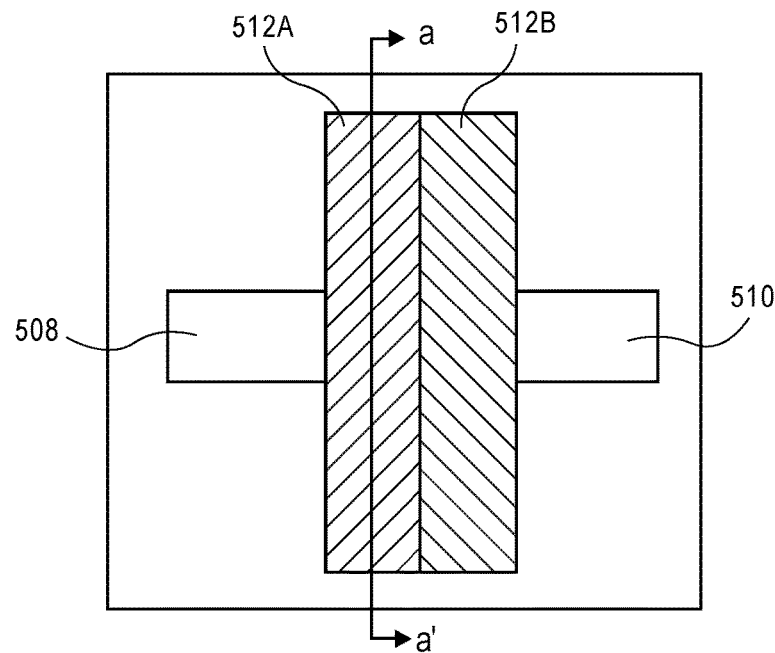
FIG. 5A
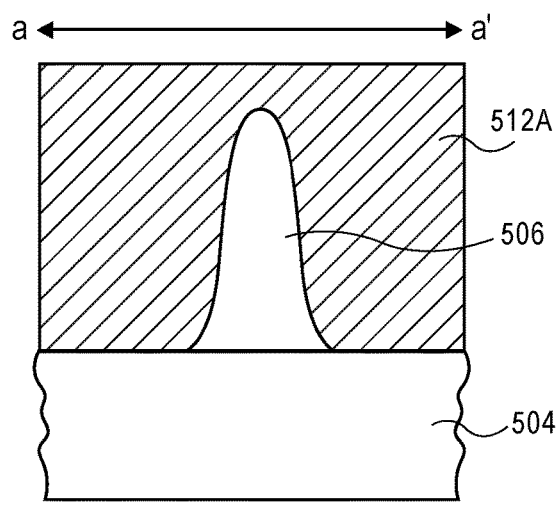 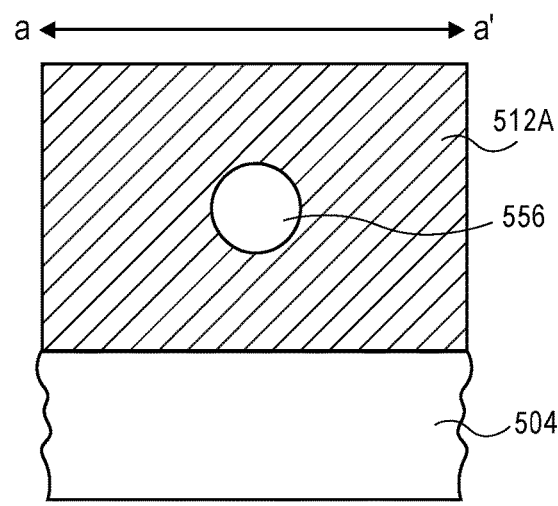
FIG. 5B  FIG. 5C

GROUP III-V SEMICONDUCTOR DEVICES HAVING DUAL WORKFUNCTION GATE ELECTRODES

CROSS-REFERENCE TO RELATED APPLICATION

This patent application is a U.S. National Phase Application under 35 U.S.C. § 371 of International Application No. PCT/US2017/053542, filed Sep. 26, 2017, entitled "GROUP III-V SEMICONDUCTOR DEVICES HAVING DUAL WORKFUNCTION GATE ELECTRODES," which designates the United States of America, the entire disclosure of which is hereby incorporated by reference in its entirety and for all purposes.

TECHNICAL FIELD

Embodiments of the present disclosure relate to semiconductor integrated circuits and more particularly to group III-V semiconductor devices having dual workfunction gate electrodes and their methods of fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

As the dimensions of fundamental building blocks of microelectronic circuitry are reduced and as the sheer number of fundamental building blocks fabricated in a given region is increased, the constraints on the semiconductor processes used to fabricate these building blocks have become overwhelming. In particular, there may be a trade-off between the smallest dimension of a feature patterned in a semiconductor stack (the critical dimension) and the spacing between such features.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIG. 5A illustrates a plan view of a group III-V semiconductor device having a dual workfunction gate electrode, in accordance with an embodiment of the present disclosure.

FIG. 5B illustrates a cross-sectional view of a fin-based group III-V semiconductor device having a dual workfunction gate electrode, in accordance with an embodiment of the present disclosure.

FIG. 5C illustrates a cross-sectional view of a nanowire-based group III-V semiconductor device having a dual workfunction gate electrode, in accordance with an embodiment of the present disclosure.

DESCRIPTION OF THE EMBODIMENTS

Figure 1A:
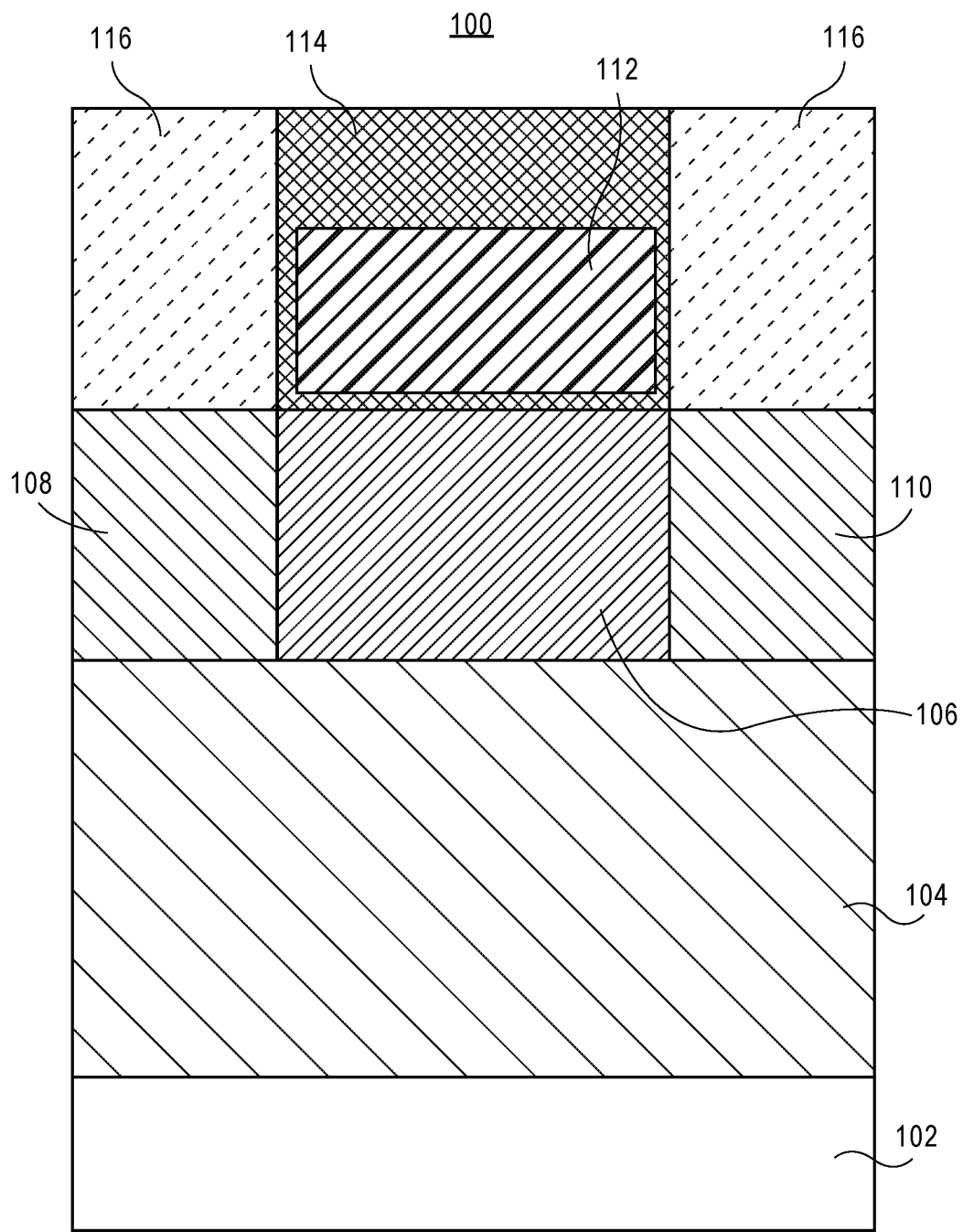
FIG. 1A illustrates a cross-sectional view of a conventional group III-V semiconductor device.

Group III-V semiconductor devices having dual workfunction gate electrodes and their methods of fabrication are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Embodiments of the present disclosure are directed to complementary metal oxide semiconductor (CMOS) devices with dual gate workfunctions for band to band tunneling (BTBT) reduction. Particular embodiments are directed to III-V semiconductor based transistor fabrication, such as devices based on indium gallium arsenide (InGaAs) channel structures on gallium arsenide (GaAs) layers or substrates. Embodiments may be implemented to address elevated off-state leakage problems associated with narrow bandgap channel materials due to band-to-band tunneling (BTBT) and BTBT induced floating body barrier lowering (BIBL) in field effect transistors (FETs). The narrow bandgap channel materials include but are not limited to group III-V semiconductor materials such as InGaAs and InAs, and group IV semiconductor materials such as Ge.

In accordance with one or more embodiments of the present disclosure, an integrated circuit structure includes dual metal gate materials of two distinct workfunctions. One gate workfunction material is placed on the source side to control thermionic leakage, and the other with a different workfunction placed on the drain side to reduce the electric field and BTBT. In an embodiment, changes in channel or source/drain materials for BTBT reduction are not necessarily needed. Embodiments may be applicable to providing reduced leakage current and leakage power in chips fabricated from high mobility transistors such as those based III-V and Ge materials.

Figure 1B:
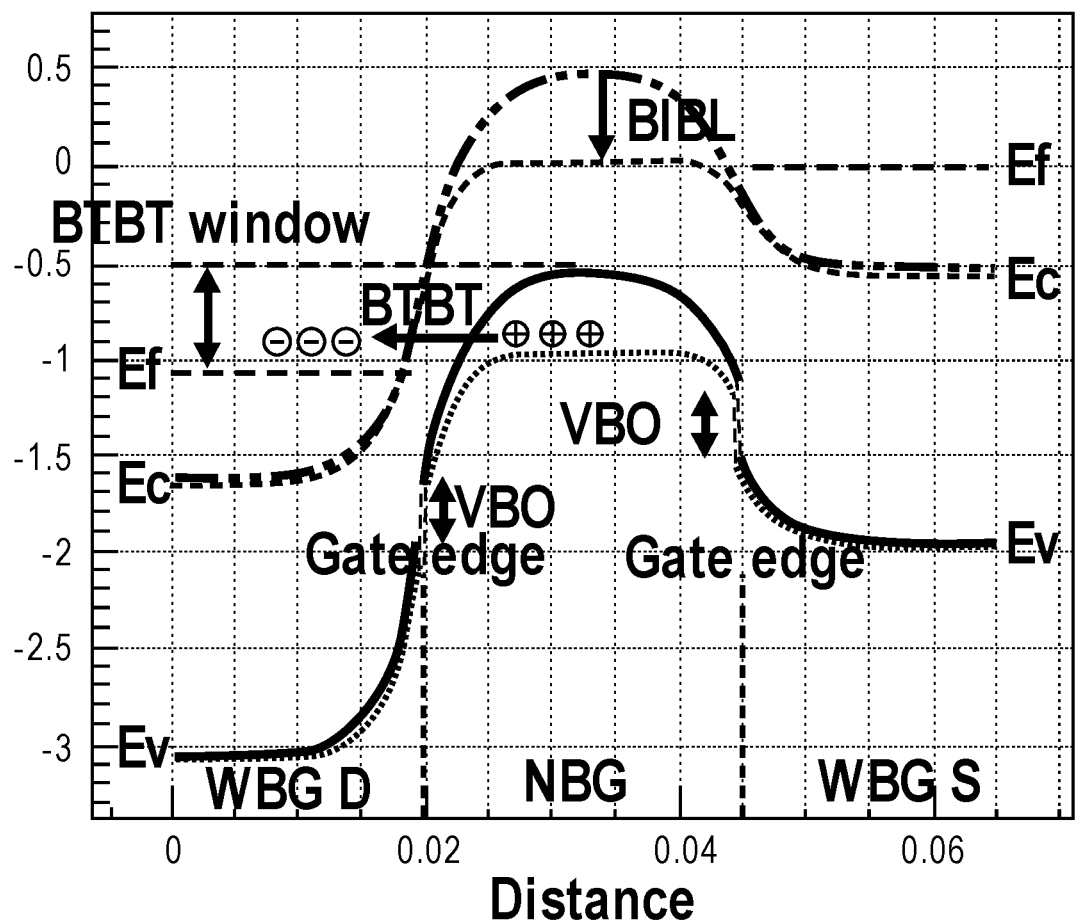
FIG. 1B is a plot showing band to band tunneling (BTBT) for the conventional group III-V semiconductor device of FIG. 1A.

To provide context, FIG. 1A illustrates a cross-sectional view of a conventional group III-V semiconductor device. FIG. 1B is a plot 150 showing band to band tunneling (BTBT) for the conventional group III-V semiconductor device of FIG. 1A.

Referring to FIG. 1A, an integrated circuit structure 100 includes a gallium arsenide layer 104 on a substrate 102. An InGaAs channel structure 106 is on the gallium arsenide layer 104. A source structure 110 is at a first end of the channel structure 106, and a drain structure 108 is at a second end of the channel structure 106. The source structure 110 and the drain structure 108 have a substantially wider band gap than the channel structure 106. A gate structure including a gate electrode 112 and surrounding gate dielectric 114 is over the channel structure 106. Source and drain contact 116 are laterally adjacent the gate electrode 112.

Referring to plot 150 of FIG. 1B, an issue with the state-of-the-art is that wide bandgap source and drain materials (110 and 108) are located in regions outside of the BTBT window. As a result there is no improvement or essentially no improvement in BTBT reduction.

By contrast, in accordance with one or more embodiments described herein, a delta workfunction from dual (e.g., N-type and P-type) metals is implemented a gate electrode to reduce not only band bending but also the BTBT window, reducing BTBT significantly. As an example, FIG. 2A illustrates a cross-sectional view of a group III-V semiconductor device having a dual workfunction gate electrode, in accordance with an embodiment of the present disclosure.

Figure 2A:
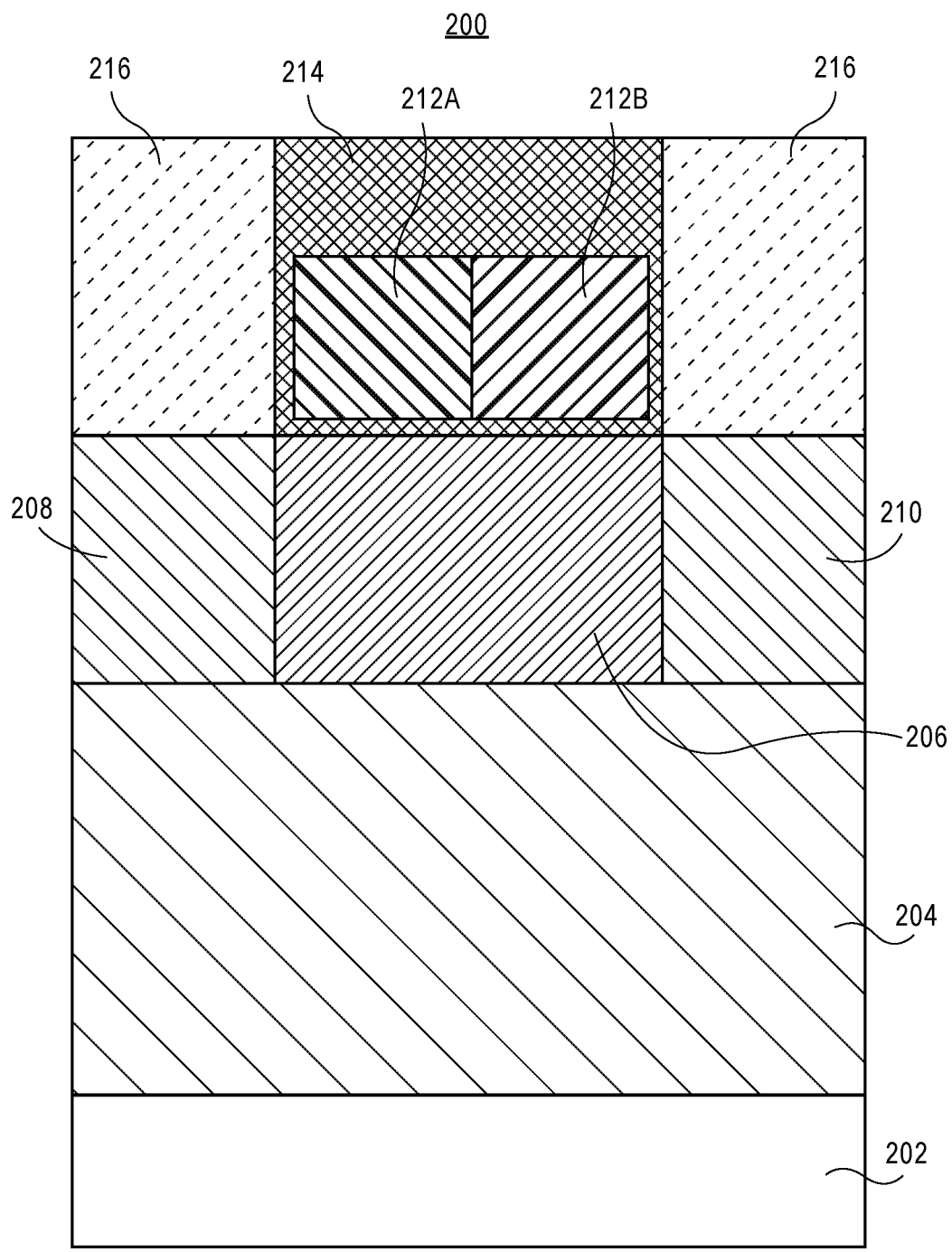
FIG. 2A illustrates a cross-sectional view of a group III-V semiconductor device having a dual workfunction gate electrode, in accordance with an embodiment of the present disclosure.

Referring to FIG. 2A, an integrated circuit structure 200 includes a gallium arsenide (GaAs) layer 204 on a substrate 202, such as a silicon (Si) substrate. A channel structure 206 is on the gallium arsenide layer 204. In an embodiment, the channel structure 206 is a III-V material channel structure. In one embodiment, the channel structure 206 includes indium, gallium and arsenic (e.g., an InGaAs channel structure). A source structure 210 is at a first end of the channel structure 206 and a drain structure 208 is at a second end of the channel structure 206. A gate structure is over the channel structure 206. In an embodiment, the gate structure has a first workfunction material 212A laterally adjacent a second workfunction material 212B. The second workfunction material 212B has a different workfunction than the first workfunction material 212A.

In an embodiment 2, the source structure 210 and the drain structure 208 have approximately the same band gap as the channel structure 206. In one such embodiment, the source structure 210 and the drain structure 208 are composed of InGaAs. In a particular such embodiment, the source structure 210 and the drain structure 208 are N+ doped to have N+ conductivity, e.g., with silicon dopant atoms.

In an embodiment, the first workfunction material 212A has a lower workfunction than the second workfunction material 212B. The first workfunction material 212A is proximate the drain structure 208, and the second workfunction material 212B is proximate the source structure 210. In one such embodiment, the first workfunction material 212A is an N-type material, such as an N-type metal gate material, and the second workfunction material 212B is a P-type material, such as a P-type metal gate material.

In an embodiment, a dielectric layer 214 is between the channel structure 206 and the gate structure 212A/212B. In an embodiment, a first conductive contact (left 216) is on the drain structure 208, and a second conductive contact (right 216) is on the source structure 210.

In an embodiment, the channel structure 206 is a fin structure, as is described in greater detail below in association with FIG. 5B. In an embodiment, the channel structure 206 is a nanowire structure, as is described in greater detail below in association with FIG. 5C.

Figure 2B:
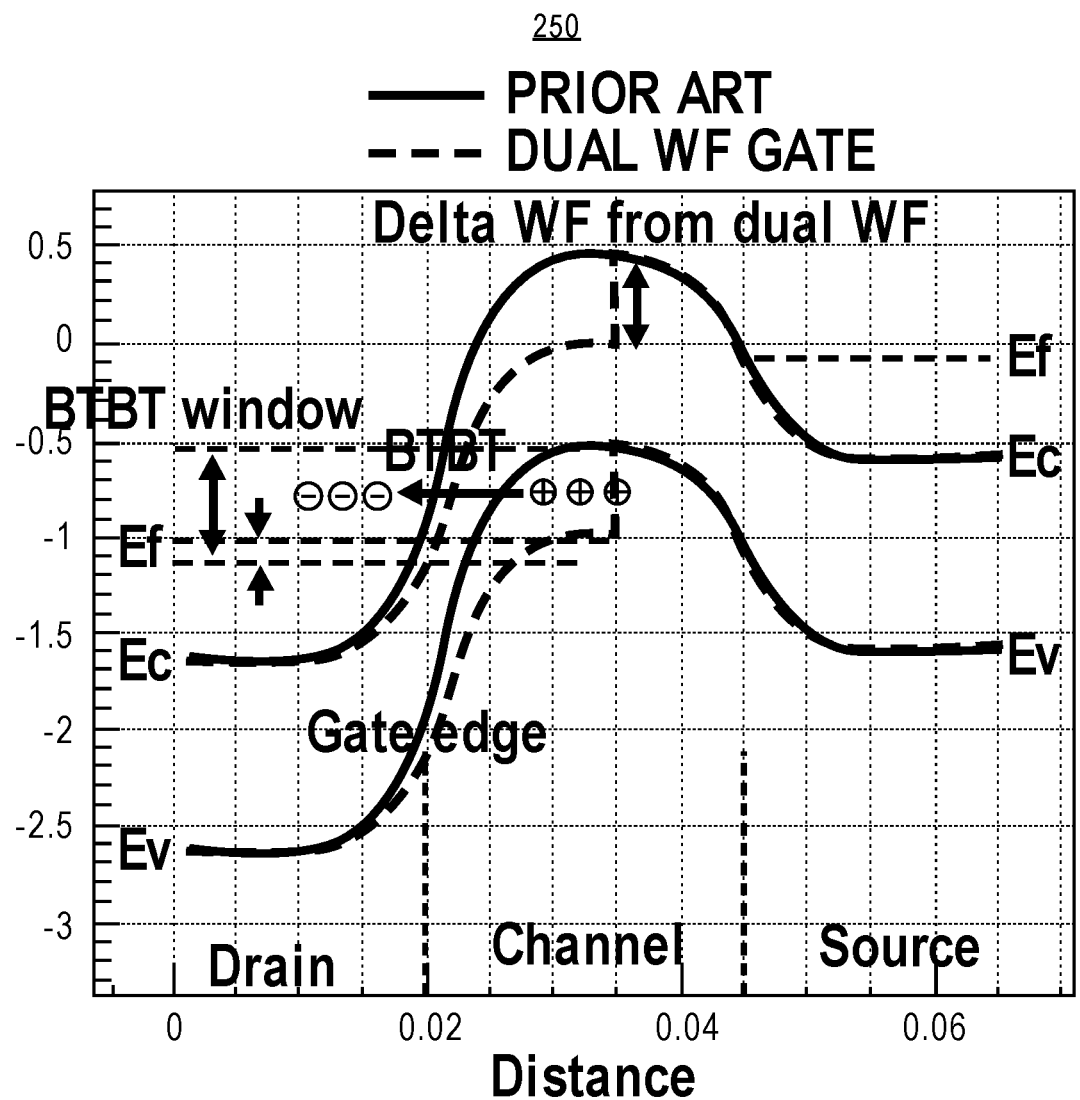
FIG. 2B is a plot showing band to band tunneling (BTBT) for the group III-V semiconductor device of FIG. 2A, in accordance with an embodiment of the present disclosure.

FIG. 2B is a plot 250 showing band to band tunneling (BTBT) for the group III-V semiconductor device of FIG. 2A, in accordance with an embodiment of the present disclosure. Referring to plot 250, in contrast to state-of-the-art device based on a single workfunction gate electrode, dual (e.g., N-type and P-type) metals are implemented as a gate electrode to reduce not only band bending but also the BTBT window, reducing BTBT significantly.

Figure 2C:
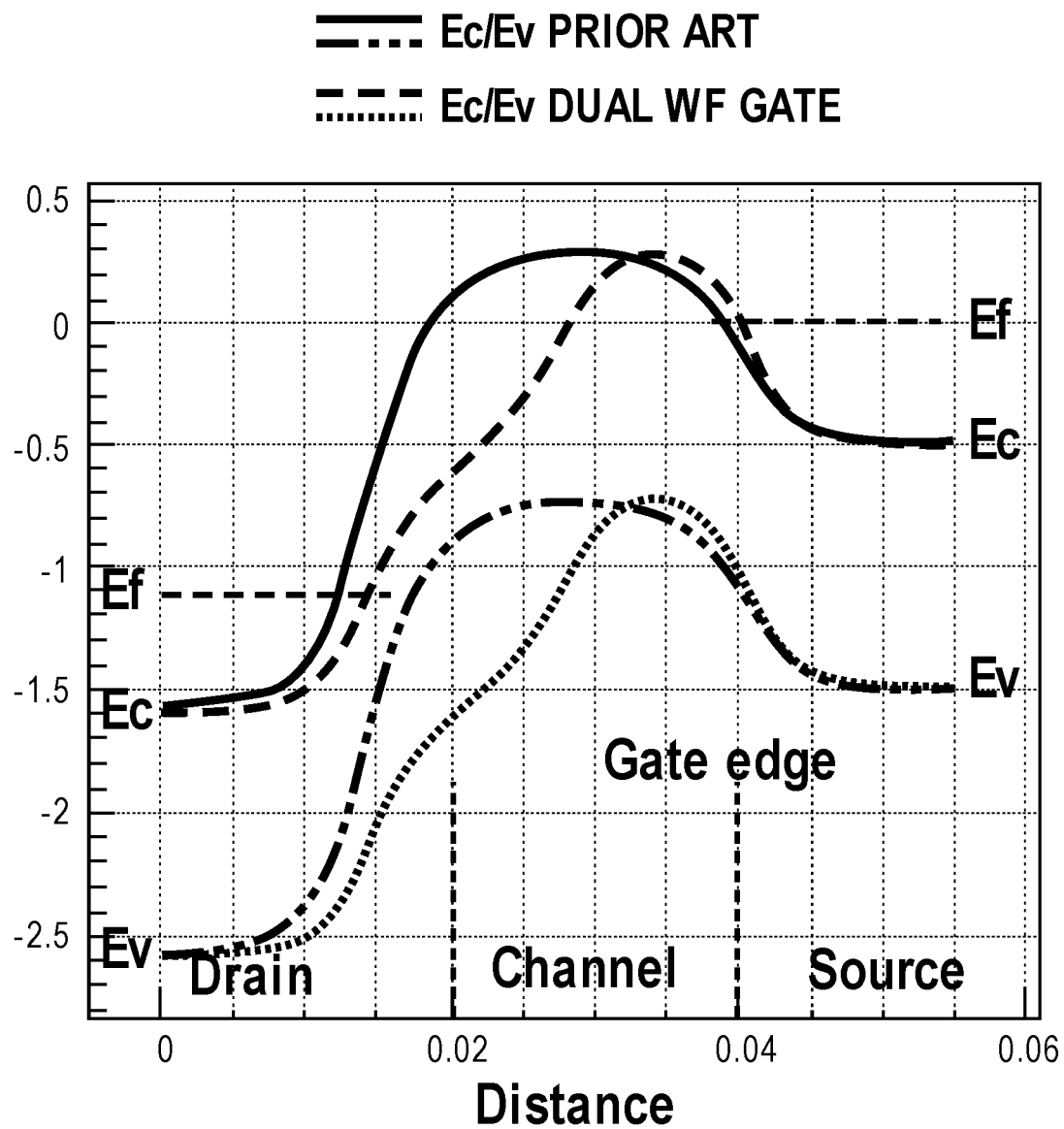
FIG. 2C is a plot showing simulated (actual) energy bands comparing the structures of FIG. 1A and FIG. 2A, in accordance with an embodiment of the present disclosure.
Figure 2D:
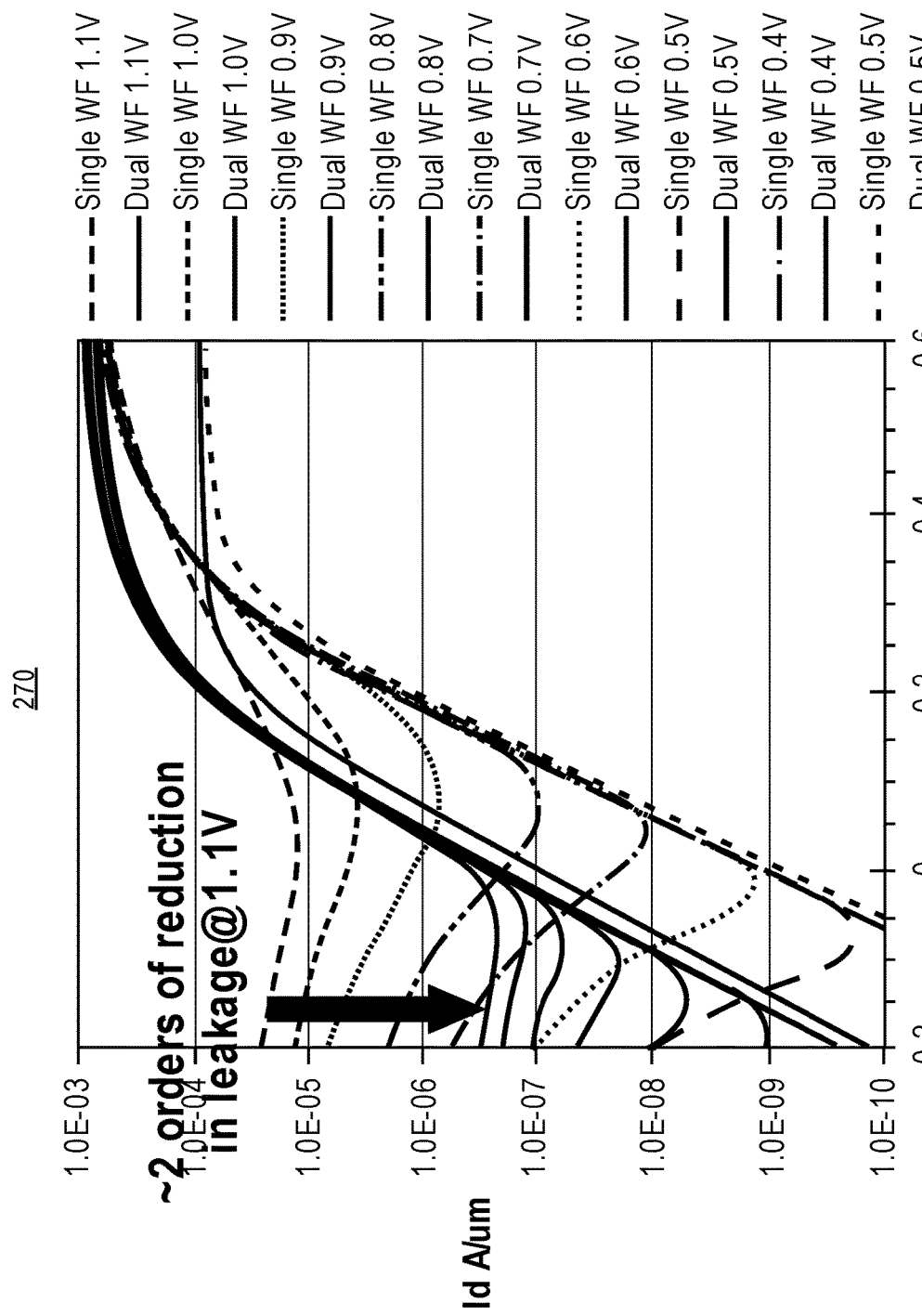
FIG. 2D is a plot showing comparison of simulated subthreshold curves comparing the structures of FIG. 1A and FIG. 2A, in accordance with an embodiment of the present disclosure.
Figure 2E:
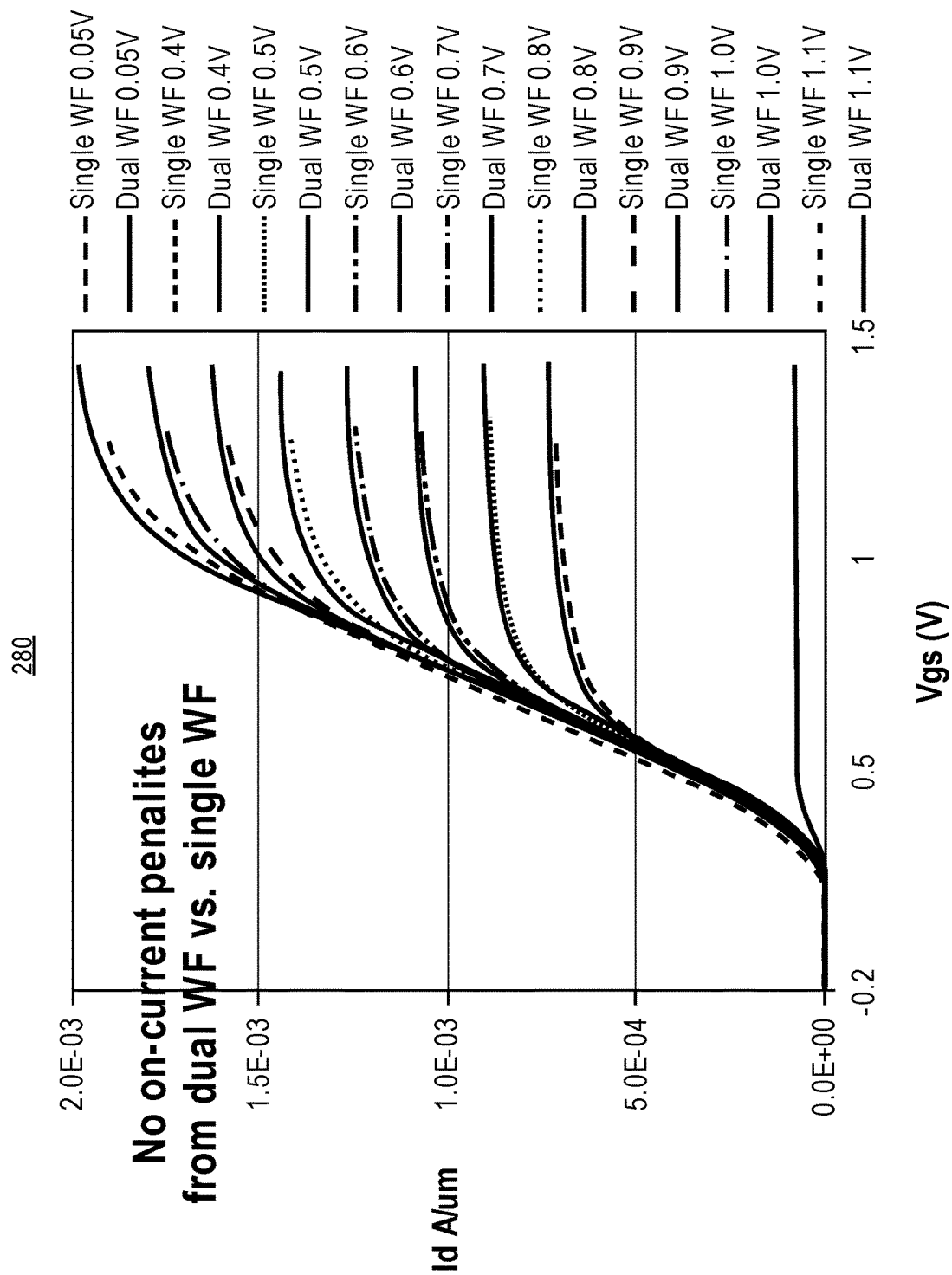
FIG. 2E is a plot showing comparison of simulated on-current comparing the structures of FIG. 1A and FIG. 2A, in accordance with an embodiment of the present disclosure.

FIG. 2C is a plot 260 showing simulated (actual) energy bands comparing the structures of FIG. 1A and FIG. 2A, in accordance with an embodiment of the present disclosure. FIG. 2D is a plot 270 showing comparison of simulated subthreshold curves comparing the structures of FIG. 1A and FIG. 2A, in accordance with an embodiment of the present disclosure. FIG. 2E is a plot 280 showing comparison of simulated on-current comparing the structures of FIG. 1A and FIG. 2A, in accordance with an embodiment of the present disclosure.

Figure 3A:
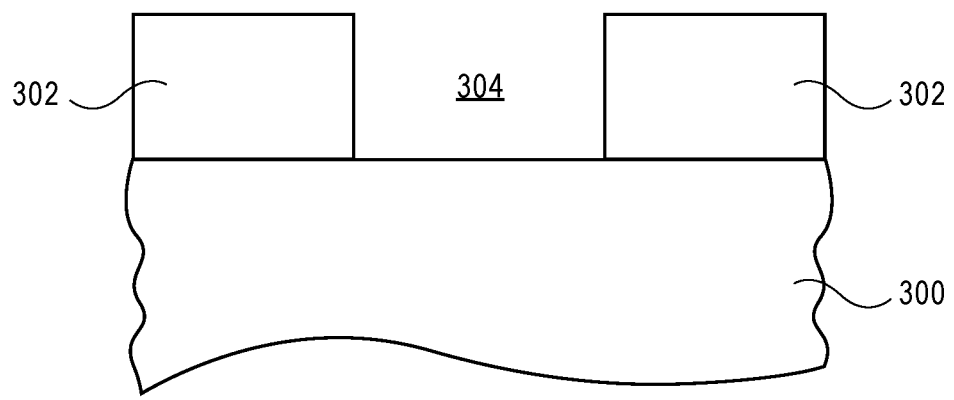
FIGS. 3A and 3B illustrate cross-sectional views of various operations in a method of fabricating a group III-V semiconductor device having a dual workfunction gate electrode, in accordance with an embodiment of the present disclosure.
Figure 3B:
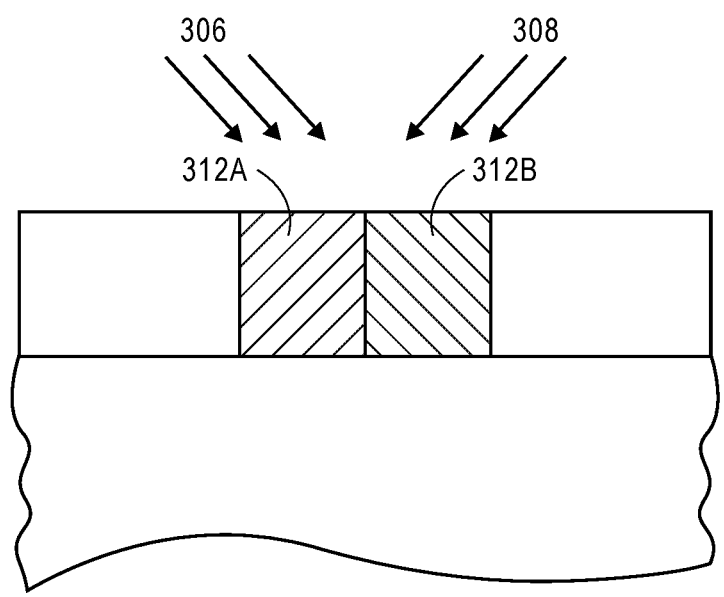

In a first exemplary processing scheme, FIGS. 3A and 3B illustrate cross-sectional views of various operations in a method of fabricating a group III-V semiconductor device having a dual workfunction gate electrode, in accordance with an embodiment of the present disclosure.

Referring to FIG. 3A, a method of fabricating an integrated circuit structure includes forming a channel structure 300, e.g., on a gallium arsenide layer above a silicon substrate or on a gallium arsenide substrate. In one embodiment, the channel structure 300 includes indium, gallium and arsenic. Although not depicted, in one embodiment, a source structure is formed at a first end of the channel structure 300 and a drain structure is formed at a second end of the channel structure 300. A gate trench 304 is formed in a dielectric layer 302 over the channel structure 300.

Referring to FIG. 3B, a first workfunction material 312A is formed in the gate trench 304 using a first angled deposition process 308. A second workfunction material 312B is formed in the gate trench 304 using a second angled deposition process 306. The first workfunction material 312A is laterally adjacent the second workfunction material 312B. In one embodiment, the second workfunction material 312B has a different workfunction than the first workfunction material 312A.

In an embodiment, the first workfunction material 312A has a lower workfunction than the second workfunction material 312B for an N-type semiconductor device. The first workfunction material 312A is proximate a drain structure, and the second workfunction material 312B is proximate a source structure. In one embodiment, the first workfunction material 312A is an N-type material, and the second workfunction material 312B is a P-type material for an N-type semiconductor device. In an embodiment, the first workfunction material 312A has a higher workfunction than the second workfunction material 312B for a P-type semiconductor device. The first workfunction material 312A is proximate a drain structure, and the second workfunction material 312B is proximate a source structure. In one embodiment, the first workfunction material 312A is a P-type material, and the second workfunction material 312B is an N-type material for a P-type semiconductor device.

In an embodiment, the channel structure 300 is a fin structure, as is described in greater detail below in association with FIG. 5B. In another embodiment, the channel structure 300 is a nanowire structure, as is described in greater detail below in association with FIG. 5C.

Figure 4A:
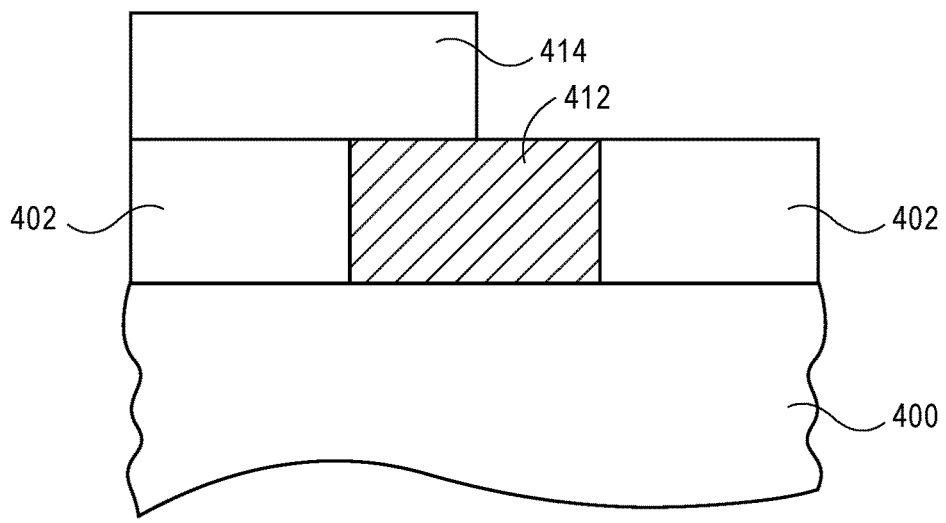
FIGS. 4A-4C illustrate cross-sectional views of various operations in another method of fabricating a group III-V semiconductor device having a dual workfunction gate electrode, in accordance with an embodiment of the present disclosure.
Figure 4B:
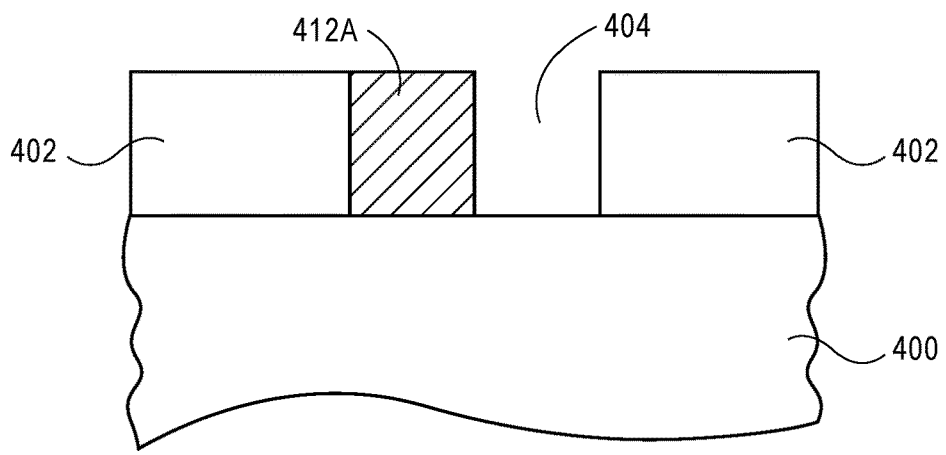
Figure 4C:
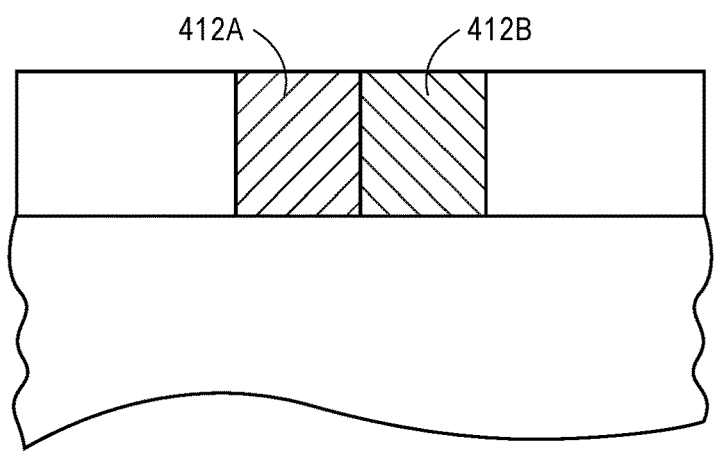

In a second exemplary processing scheme, FIGS. 4A-4C illustrate cross-sectional views of various operations in another method of fabricating a group III-V semiconductor device having a dual workfunction gate electrode, in accordance with an embodiment of the present disclosure.

Referring to FIG. 4A, a method of fabricating an integrated circuit structure includes forming a channel structure 400, e.g., on a gallium arsenide layer above a silicon substrate or on a gallium arsenide substrate. In one embodiment, the channel structure 400 includes indium, gallium and arsenic. Although not depicted, in one embodiment, a source structure is formed at a first end of the channel structure 400 and a drain structure is formed at a second end of the channel structure 400. A gate trench is formed in a dielectric layer 402 over the channel structure 400. A first workfunction material 412 is formed to completely fill the gate trench. A mask layer 414 is formed to cover approximately half of the first workfunction material 412.

Referring to FIG. 4B, the first workfunction material 412 is patterned in the gate trench, e.g., using an etch process, to form an opening 404 at a side of the gate trench. The patterning leaves first workfunction material 412A remaining in the gate trench.

Referring to FIG. 4C, a second workfunction material 412B is formed in the opening 404 at the side of gate trench. The first workfunction material 412A is laterally adjacent the second workfunction material 412B. In one embodiment, the second workfunction material 412B has a different workfunction than the first workfunction material.

In an embodiment, the first workfunction material 412A has a lower workfunction than the second workfunction material 412B for an N-type semiconductor device. The first workfunction material 412A is proximate a drain structure, and the second workfunction material 412B is proximate a source structure. In one embodiment, the first workfunction material 412A is an N-type material, and the second workfunction material 412B is a P-type material for an N-type semiconductor device. In an embodiment, the first workfunction material 412A has a higher workfunction than the second workfunction material 412B for a P-type semiconductor device. The first workfunction material 412A is proximate a drain structure, and the second workfunction material 412B is proximate a source structure. In one embodiment, the first workfunction material 412A is a P-type material, and the second workfunction material 412B is an N-type material for a P-type semiconductor device.

In an embodiment, the channel structure 400 is a fin structure, as is described in greater detail below in association with FIG. 5B. In another embodiment, the channel structure 400 is a nanowire structure, as is described in greater detail below in association with FIG. 5C.

It is to be appreciated that a semiconductor channel structure as disclosed herein may be a planar channel structure or a non-planar channel structure. FIG. 5A illustrates a plan view of a group III-V semiconductor device having a dual workfunction gate electrode, in accordance with an embodiment of the present disclosure. It is to be appreciated that the plan view of FIG. 5A is applicable to both planar channel structure embodiments and non-planar channel structure embodiments.

Referring to FIG. 5A, an integrated circuit structure includes channel structure (covered) having a source structure 510 is at a first end of the channel structure and a drain structure 508 is at a second end of the channel structure. A gate structure is over the channel structure and includes a first workfunction material 512A laterally adjacent a second workfunction material 512B. In one embodiment, the second workfunction material 512B has a different workfunction than the first workfunction material 512A.

FIG. 5B illustrates a cross-sectional view of a fin-based group III-V semiconductor device having a dual workfunction gate electrode, in accordance with an embodiment of the present disclosure.

Referring to FIG. 5B, a gallium arsenide (GaAs) substrate or layer 504, e.g., a layer on a silicon substrate, such as a silicon (Si) substrate, is provided. A fin channel structure 506 is on the gallium arsenide layer 504. In an embodiment, the fin channel structure 506 is a III-V material channel structure. In one embodiment, the fin channel structure 506 includes indium, gallium and arsenic (e.g., an InGaAs fin channel structure).

FIG. 5C illustrates a cross-sectional view of a nanowire-based group III-V semiconductor device having a dual workfunction gate electrode, in accordance with an embodiment of the present disclosure.

Referring to FIG. 5C, a gallium arsenide (GaAs) substrate or layer 504, e.g., a layer on a silicon substrate, such as a silicon (Si) substrate, is provided. A nanowire channel structure 556 is on the gallium arsenide layer 504. In an embodiment, the nanowire channel structure 556 is a III-V material channel structure. In one embodiment, the nanowire channel structure 556 includes indium, gallium and arsenic (e.g., an InGaAs nanowire channel structure).

Implementations of embodiments of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
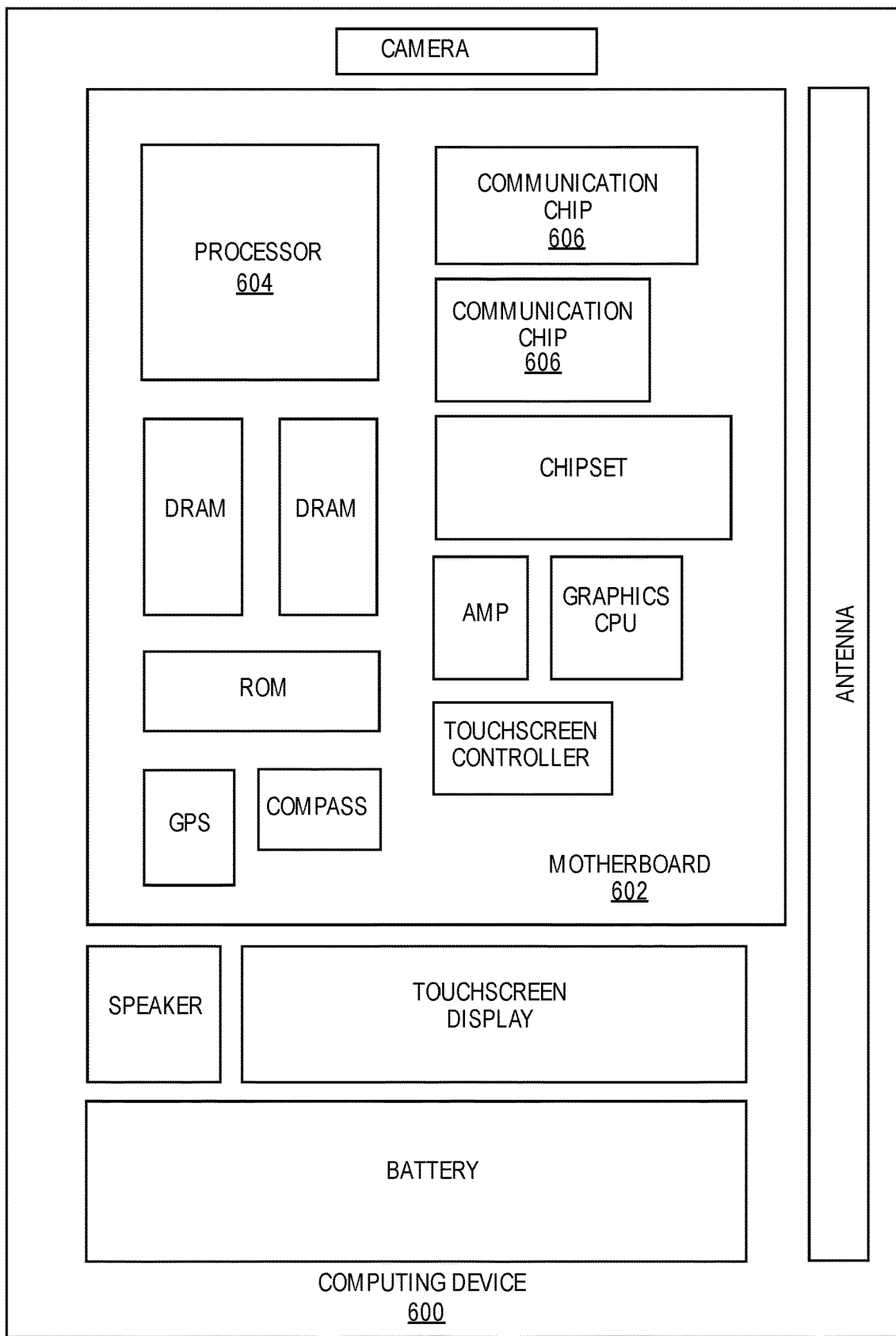
FIG. 6 illustrates a computing device in accordance with one implementation of the disclosure.

FIG. 6 illustrates a computing device 600 in accordance with one implementation of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the disclosure, the integrated circuit die of the processor includes one or more devices, such as group III-V semiconductor devices having dual workfunction gate electrodes built in accordance with implementations of the disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the disclosure, the integrated circuit die of the communication chip includes one or more devices, such as group III-V semiconductor devices having dual workfunction gate electrodes built in accordance with implementations of the disclosure.

In further implementations, another component housed within the computing device 600 may contain an integrated circuit die that includes one or more devices, such as group III-V semiconductor devices having dual workfunction gate electrodes built in accordance with implementations of the disclosure.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
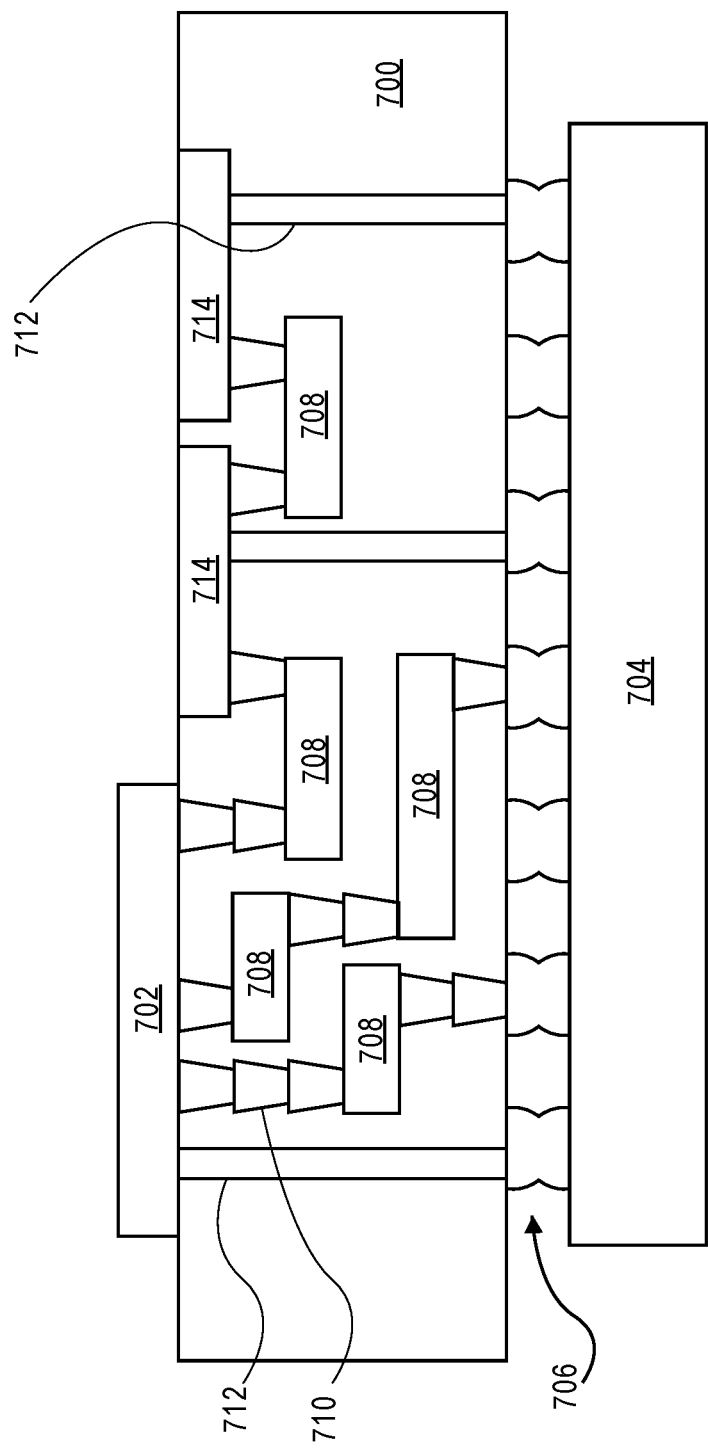
FIG. 7 illustrates an interposer that includes one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments described herein include group III-V semiconductor devices having dual workfunction gate electrodes and their methods of fabrication.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a gallium arsenide layer on a substrate. A channel structure is on the gallium arsenide layer. The channel structure includes indium, gallium and arsenic. A source structure is at a first end of the channel structure and a drain structure is at a second end of the channel structure. A gate structure is over the channel structure, the gate structure having a first workfunction material laterally adjacent a second workfunction material. The second workfunction material has a different workfunction than the first workfunction material.

Example Embodiment 2

The integrated circuit structure of example embodiment 1, wherein the source structure and the drain structure have approximately the same band gap as the channel structure.

Example Embodiment 3

The integrated circuit structure of example embodiment 1 or 2, wherein the source structure and the drain structure are doped with N+ conductivity.

Example Embodiment 4

The integrated circuit structure of example embodiment 1, 2 or 3, wherein the first workfunction material has a lower workfunction than the second workfunction material, the first workfunction material is proximate the drain structure, and the second workfunction material is proximate the source structure.

Example Embodiment 5

The integrated circuit structure of example embodiment 1, 2, 3 or 4, wherein the first workfunction material is an N-type material, and the second workfunction material is a P-type material.

Example Embodiment 6

The integrated circuit structure of example embodiment 1, 2, 3, 4 or 5, further including a dielectric layer between the channel structure and the gate structure.

Example Embodiment 7

The integrated circuit structure of example embodiment 1, 2, 3, 4, 5 or 6, further including a first conductive contact on the drain structure, and a second conductive contact on the source structure.

Example Embodiment 8

The integrated circuit structure of example embodiment 1, 2, 3, 4, 5, 6 or 7, wherein the channel structure is a fin structure.

Example Embodiment 9

The integrated circuit structure of example embodiment 1, 2, 3, 4, 5, 6 or 7, wherein the channel structure is a nanowire structure.

Example Embodiment 10

A method of fabricating an integrated circuit structure includes forming a channel structure on a gallium arsenide layer above a substrate. The channel structure includes indium, gallium and arsenic. A source structure is formed at a first end of the channel structure and a drain structure is formed at a second end of the channel structure. A gate trench is formed in a dielectric layer over the channel structure. A first workfunction material is formed in the gate trench using a first angled deposition process. A second workfunction material is formed in the gate trench using a second angled deposition process. The first workfunction material is laterally adjacent the second workfunction material. The second workfunction material has a different workfunction than the first workfunction material.

Example Embodiment 11

The integrated circuit structure of example embodiment 10, wherein the source structure and the drain structure have approximately the same band gap as the channel structure.

Example Embodiment 12

The integrated circuit structure of example embodiment 10 or 11, wherein the source structure and the drain structure are doped with N+ conductivity.

Example Embodiment 13

The integrated circuit structure of example embodiment 10, 11 or 12, wherein the first workfunction material has a lower workfunction than the second workfunction material, the first workfunction material is proximate the drain structure, and the second workfunction material is proximate the source structure.

Example Embodiment 14

The integrated circuit structure of example embodiment 10, 11, 12 or 13, wherein the first workfunction material is an N-type material, and the second workfunction material is a P-type material.

Example Embodiment 15

The integrated circuit structure of example embodiment 10, 11, 12, 13 or 14, further including forming a first conductive contact on the drain structure, and forming a second conductive contact on the source structure.

Example Embodiment 16

The integrated circuit structure of example embodiment 10, 11, 12, 13, 14 or 15, wherein the channel structure is a fin structure.

Example Embodiment 17

The integrated circuit structure of example embodiment 10, 11, 12, 13, 14 or 15, wherein the channel structure is a nanowire structure.

Example Embodiment 18

A method of fabricating an integrated circuit structure includes forming a channel structure on a gallium arsenide layer above a substrate. The channel structure includes indium, gallium and arsenic. A source structure is formed at a first end of the channel structure and a drain structure is formed at a second end of the channel structure. A gate trench is formed in a dielectric layer over the channel structure. A first workfunction material is formed to completely fill the gate trench. The first workfunction material is patterned in the gate trench to form an opening at a side of the gate trench. A second workfunction material is formed in the opening at the side of gate trench. The first workfunction material is laterally adjacent the second workfunction material. The second workfunction material has a different workfunction than the first workfunction material.

Example Embodiment 19

The integrated circuit structure of example embodiment 18, wherein the source structure and the drain structure have approximately the same band gap as the channel structure.

Example Embodiment 20

The integrated circuit structure of example embodiment 18 or 19, wherein the source structure and the drain structure are doped with N+ conductivity.

Example Embodiment 21

The integrated circuit structure of example embodiment 18, 19 or 20, wherein the first workfunction material has a lower workfunction than the second workfunction material, the first workfunction material is proximate the drain structure, and the second workfunction material is proximate the source structure.

Example Embodiment 22

The integrated circuit structure of example embodiment 18, 19, 20 or 21, wherein the first workfunction material is an N-type material, and the second workfunction material is a P-type material.

Example Embodiment 23

The integrated circuit structure of example embodiment 18, 19, 20, 21 or 22, further including forming a first conductive contact on the drain structure, and forming a second conductive contact on the source structure.

Example Embodiment 24

The integrated circuit structure of example embodiment 18, 19, 20, 21, 22 or 23, wherein the channel structure is a fin structure.

Example Embodiment 25

The integrated circuit structure of example embodiment 18, 19, 20, 21, 22 or 23, wherein the channel structure is a nanowire structure.

What is claimed is:
1. An integrated circuit structure, comprising:
a gallium arsenide layer on a substrate;
a channel structure on the gallium arsenide layer, the channel structure comprising indium, gallium and arsenic;
a source structure at a first end of the channel structure and a drain structure at a second end of the channel structure;
a gate structure over the channel structure, the gate structure having a first workfunction material laterally adjacent a second workfunction material, the second workfunction material having a different workfunction than the first workfunction material, the first workfunction material having an uppermost surface, and the second workfunction material having an uppermost surface; and
a gate dielectric layer between the channel structure and the gate structure, the gate dielectric layer further along a sidewall of the first workfunction material and along a sidewall of the second workfunction material, the gate dielectric layer extending above the uppermost surface of the first workfunction material, and the gate dielectric layer extending above the uppermost surface of the second workfunction material.

2. The integrated circuit structure of claim 1, wherein the source structure and the drain structure are doped with N+ conductivity.

3. The integrated circuit structure of claim 1, wherein the first workfunction material has a lower workfunction than the second workfunction material, the first workfunction material is proximate the drain structure, and the second workfunction material is proximate the source structure.

4. The integrated circuit structure of claim 1, wherein the first workfunction material is an N-type material, and the second workfunction material is a P-type material.

5. The integrated circuit structure of claim 1, further comprising:

a first conductive contact on the drain structure, and
a second conductive contact on the source structure.

6. The integrated circuit structure of claim 1, wherein the channel structure is a fin structure.

7. The integrated circuit structure of claim 1, wherein the channel structure is a nanowire structure.

8. A method of fabricating an integrated circuit structure, the method comprising:
   forming a channel structure on a gallium arsenide layer above a substrate, the channel structure comprising indium, gallium and arsenic;
   forming a source structure at a first end of the channel structure and a drain structure at a second end of the channel structure;
   forming a gate trench in a dielectric layer over the channel structure;
   forming a gate dielectric layer on the channel structure;
   forming a first workfunction material in the gate trench and on the gate dielectric layer using a first angled deposition process; and
   forming a second workfunction material in the gate trench and on the gate dielectric layer using a second angled deposition process, the first workfunction material laterally adjacent the second workfunction material, the second workfunction material having a different workfunction than the first workfunction material, the first workfunction material having an uppermost surface, and the second workfunction material having an uppermost surface, wherein the gate dielectric layer is further along a sidewall of the first workfunction material and along a sidewall of the second workfunction material, the gate dielectric layer extending above the uppermost surface of the first workfunction material, and the gate dielectric layer extending above the uppermost surface of the second workfunction material.

9. The method of claim 8, wherein the source structure and the drain structure are doped with N+ conductivity.

10. The method of claim 8, wherein the first workfunction material has a lower workfunction than the second workfunction material, the first workfunction material is proximate the drain structure, and the second workfunction material is proximate the source structure.

11. The method of claim 8, wherein the first workfunction material is an N-type material, and the second workfunction material is a P-type material.

12. The method of claim 8, further comprising:
   forming a first conductive contact on the drain structure; and
   forming a second conductive contact on the source structure.

13. The method of claim 8, wherein the channel structure is a fin structure.

14. The method of claim 8, wherein the channel structure is a nanowire structure.

15. A method of fabricating an integrated circuit structure, the method comprising:
   forming a channel structure on a gallium arsenide layer above a substrate, the channel structure comprising indium, gallium and arsenic;
   forming a source structure at a first end of the channel structure and a drain structure at a second end of the channel structure;
   forming a gate trench in a dielectric layer over the channel structure;
   forming a gate dielectric layer on the channel structure;
   forming a first workfunction material to completely fill the gate trench;
   patterning the first workfunction material in the gate trench and on the gate dielectric layer to form an opening at a side of the gate trench;
   forming a second workfunction material in the opening at the side of gate trench and on the gate dielectric layer, the first workfunction material laterally adjacent the second workfunction material, the second workfunction material having a different workfunction than the first workfunction material, the first workfunction material having an uppermost surface, and the second workfunction material having an uppermost surface, wherein the gate dielectric layer is further along a sidewall of the first workfunction material and along a sidewall of the second workfunction material, the gate dielectric layer extending above the uppermost surface of the first workfunction material, and the gate dielectric layer extending above the uppermost surface of the second workfunction material.

16. The method of claim 15, wherein the source structure and the drain structure are doped with N+ conductivity.

17. The method of claim 15, wherein the first workfunction material has a lower workfunction than the second workfunction material, the first workfunction material is proximate the drain structure, and the second workfunction material is proximate the source structure.

18. The method of claim 15, wherein the first workfunction material is an N-type material, and the second workfunction material is a P-type material.

19. The method of claim 15, further comprising: forming a first conductive contact on the drain structure; and forming a second conductive contact on the source structure.

20. The method of claim 15, wherein the channel structure is a fin structure.

21. The method of claim 15, wherein the channel structure is a nanowire structure.

* * * * *